United States Patent
Wakabayashi et al.

[11] Patent Number: 5,596,596
[45] Date of Patent: Jan. 21, 1997

[54] NARROW BAND EXCIMER LASER

[75] Inventors: Osamu Wakabayashi; Masahiko Kowaka; Yukio Kobayashi, all of Hiratsuka, Japan

[73] Assignee: Kabushiki Kaisha Komatsu Seisakusho, Japan

[21] Appl. No.: 573,593

[22] Filed: Dec. 15, 1995

Related U.S. Application Data

[63] Continuation of Ser. No. 164,613, Dec. 8, 1993, abandoned, which is a continuation of Ser. No. 775,998, filed as PCT/JP90/00639, May 18, 1990, published as WO90/14704, Nov. 29, 1990, abandoned.

[30] Foreign Application Priority Data

May 18, 1989 [JP] Japan ................... 1-124898

[51] Int. Cl.$^6$ .................................. H01S 3/08
[52] U.S. Cl. ................ 372/102; 372/57; 372/103; 372/20; 372/99
[58] Field of Search ................ 372/102, 92, 57, 372/20, 108, 98, 103, 99

[56] References Cited

U.S. PATENT DOCUMENTS

| | | | |
|---|---|---|---|
| 4,264,141 | 4/1981 | Guers et al. | 359/326 |
| 4,829,536 | 5/1989 | Kajiyama et al. | 372/57 |
| 4,873,692 | 10/1989 | Johnson et al. | 372/102 |
| 4,905,243 | 2/1990 | Lokai et al. | 372/102 |
| 4,914,662 | 4/1990 | Nakatani et al. | 372/32 |
| 4,918,704 | 4/1990 | Caprara et al. | 372/99 |
| 4,926,428 | 5/1990 | Kajiyama et al. | 372/20 |
| 4,953,175 | 9/1990 | De Silvestri et al. | 372/99 |
| 4,961,195 | 10/1990 | Skupsky et al. | 372/31 |
| 4,985,898 | 1/1991 | Furuya et al. | 372/106 |
| 4,991,178 | 2/1991 | Wani et al. | 372/108 |

FOREIGN PATENT DOCUMENTS 62-211977  9/1987  Japan.

OTHER PUBLICATIONS

Itoh, et al., "An Analytical Study of the Echelette Grating with Application to Open Resonators," *IEEE Transactions on Microwave Theory and Techniques*, vol. MTT17, No. 6, pp. 319–327.

Armandillo, et al., "Estimation of the Minimum Laser Linewidth Achievable With a Grazing–Grating Configuration," *Optics Letters*, vol. 8, No. 5, pp. 274–276.

Bobrovskii, et al., "Continuously Tunable Tea $CO_2$ Laser," *Soviet Journal of Quantum Electronics*, vol. 17, No. 9, pp. 1157–1159.

Publication *Laser Handbook*, The Laswer Society of Japan.

*Primary Examiner*—Leon Scott, Jr.
*Attorney, Agent, or Firm*—Welsh & Katz, Ltd.

[57] ABSTRACT

A narrow-band excimer laser employing a diffraction grating as a wavelength selective element, which is particularly suited for a light source of a reduction projection aligner. The grating used in the narrow-band excimer laser of the invention is so disposed that the ruling direction of the grating is nearly perpendicular to the direction of laser discharge. When a beam expander is used to expand laser beam falling on the beam expander is so disposed that the direction of beam expansion is nearly perpendicular to that of discharge of the laser. Further, when an aperture is to be used in the laser cavity, the aperture is placed so that the longitudinal direction may be parallel to the direction of laser discharge. Moreover, the front mirror of the laser cavity is a cylindrical one, whose mechanical axis is in parallel with the direction of laser discharge. This makes it possible to provide a narrow-band excimer laser having very high efficiency and excellent durability.

7 Claims, 10 Drawing Sheets

5,596,596

NARROW BAND EXCIMER LASER

This is a continuation of application Ser. No. 164,613, filed Dec. 8, 1993, now abandoned, which is a continuation of application Ser. No. 775,998, filed as PCT/JP90/00639 on May 18, 1990 and published as WO90/14704 on Nov. 29, 1990, now abandoned.

FIELD OF ART

This invention relates to a narrow band excimer laser, and more particularly a narrow-band excimer laser suitable for use as a light source of a reduction projection aligner.

BACKGROUND ART

An attention has been paid to the use of an excimer laser as a light source of reduction projection aligner (hereinafter called a stepper) for manufacturing semiconductor devices. This is because the excimer laser may possibly extend the light exposure limit to be less than 0.5 μm since the wavelength of the excimer laser is short (for example the wavelength of KrF laser is about 248.4 nm), because with the same resolution, the focal depth is greater than a g line or an i line of a mercury lamp conventionally used, because the numerical aperture (NA) of a lens can be made small so that the exposure region can be enlarged and large power can be obtained, and because many other advantages can be expected.

An excimer laser utilized as a light source of the stepper is required to have a narrow bandwidth with a beam width of less than 3 pm as well as a large output power.

A technique of narrowing the bandwidth of the excimer laser beam is known as the injection lock method. In the injection lock method, wavelength selecting element (etalon, diffraction grating, prism, etc.) are disposed in a cavity of an oscillation stage so as to generate a single mode oscillation by limiting the space mode by using a pin hole and to injection synchronize the laser beam in an amplification stage. With this method, however, although a relatively large output power can be obtained, there are such defects that a misshot occurs, that it is difficult to obtain 100% the locking efficiency, and that the spectrum purity degrades. Furthermore, in this method, the output light beam has a high degree of coherency so that when the output light beam is used as a light source of the reduction type projection aligner, a speckle pattern generates. Generally it is considered that the generation of speckle pattern depends upon the number of space transverse modes. When the number of space transverse modes contained in the laser light is small, the speckle pattern becomes easy to generate. Conversely, when the number of the space transverse modes increases, the speckle pattern becomes difficult to generate art. The injection lock method described above is a technique for narrowing the bandwidth by greatly decreasing the number of space transverse modes. Since generation of speckle pattern causes a serious problem, this technique can not be adopted in the reduction type projection aligner.

Another projection technique for narrowing the bandwidth of the excimer layer beam is a technique utilizing a air gap etalon acting as a wavelength selective element. A prior art technique utilizing the air gap etalon was developed by AT & T Bell Laboratory wherein an air gap etalon is disposed between the front mirror and a laser chamber of an excimer laser device so as to narrow the bandwidth of the excimer laser. This system, however, cannot obtain a very narrow spectral bandwidth. In addition there are problems that the power loss is large due to the insertion of the air gap etalon. Further it is impossible to greatly increase the number of the space transverse modes. Furthermore, the air gap etalon has a problem of poor durability.

Accordingly, an excimer laser device has been proposed wherein a relatively high durable diffraction grating is used as the wavelength selective element. However, in the prior art device utilizing the diffraction grating, there is a problem in the manner of utilizing it so that it is impossible to efficiently reduce the bandwidth.

As above described, the prior art excimer laser device have problems in narrowing the bandwidth, output power, the number of the space transverse modes, or durability so that it has been impossible to use the conventional excimer laser devices as the light source of a stepper.

Accordingly, it is an object of this invention to provide a narrow-band oscillation excimer laser device utilizing a diffraction grating as a wavelength selecting element and capable of efficiently reducing the bandwidth.

DISCLOSURE OF THE INVENTION

In the narrow band excimer laser, it is so arranged that the ruling direction of the grating is substantially perpendicular to the discharge direction of the laser.

Where a beam expander is used to expand the light beam irradiating the grating, the beam expander is arranged such that its direction of beam expanding is substantially perpendicular to the laser discharge direction.

Where an aperture is disposed in a light resonator (laser cavity), the aperture has elongated sides in parallel with the direction of discharge of the laser device.

Further, the front mirror of the light resonator is of a cylindrical mirror with its mechanical axis being coincide (parallel) with the laser discharge direction.

In an excimer laser device, the beam expanding angle is larger in the discharge direction of the laser device than in a direction perpendicular to the discharge direction, so that by making the ruling direction of the grating to be substantially perpendicular to the discharge direction of the laser device, it is possible to efficiently narrow the bandwidth.

Also by making the beam expanding direction of the beam expander to be substantially perpendicular to the discharge direction of the laser device, the efficiency of narrowing the bandwidth can be improved.

Further, by making the aperture disposed in a light resonator as having longer sides in parallel with the direction of discharge of the laser device, the efficiency of narrowing the bandwidth can be improved.

Furthermore, by using for the front mirror of the light resonator a cylindrical mirror with the mechanical axis of the cylindrical mirror being coincide with the discharge direction of the laser device, the efficiency of narrowing the bandwidth can be further improved.

BEST MODE OF CARRYING OUT THE INVENTION

Figure 1:
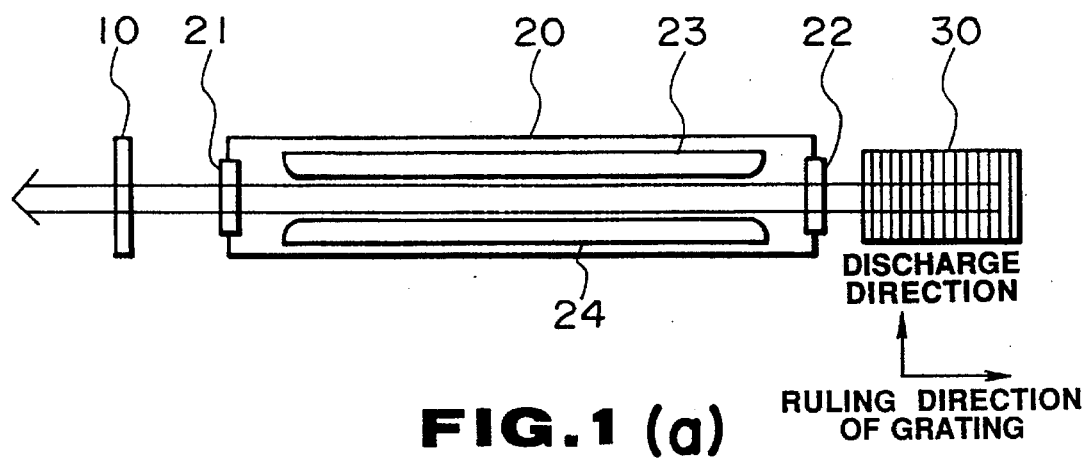
FIGS. 1a and 1b are a side view and a plan view respectively showing one embodiment of this invention in the form of a Littrow mount.
Figure 1:
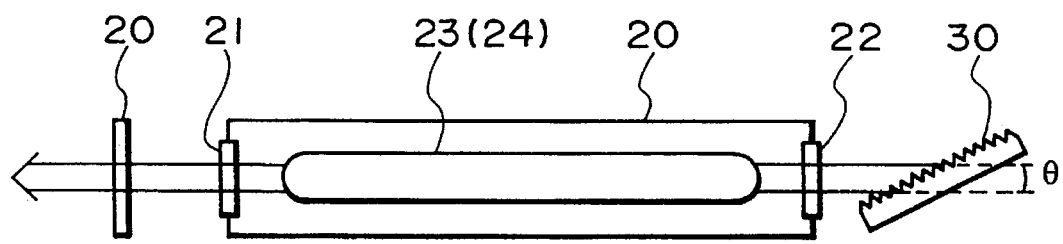

Some embodiments of a narrow-band excimer laser of this invention will now be described in detail with reference to the accompanying drawings.

The narrow band excimer laser shown in FIGS. 1a and 1b is made up of a front mirror 10, a laser chamber 20, and a diffraction grating 30 acting as a rear mirror, thus taking a so-called Littrow mount. In the laser chamber 20 KrF, etc. acting as a laser gas is sealed. For electrically discharging and exciting the laser gas, there are provided electrodes 23 and 24. Further, the laser chamber 20 is provided with windows 21 and 22 for transmitting the oscillated laser beam.

The purpose of the grating 30 is to select a beam of a specific wavelength by utilizing the diffraction of the beam. The grating 30 is provided with a plurality of tooth grooves arranged in a definite direction. In this specification, a direction perpendicular to these grooves is termed ruling direction of grating. Grating 30 can select a beam having the specific wavelength by varying angle of the grating 30 with respect to an incident beam in a plane including the ruling direction of the grating. More particularly, the grating 30 acts to reflect only a specific beam corresponding to the angle θ of the grating with respect to the incident beam in a predetermined direction, in this case the direction of the incident beam, thus effecting a selective operation of a beam having the specific wavelength.

This embodiment is characterized in that the arrangement of the grating 30 with respect to the electrodes 23 and 24 in the laser chamber 20 is selected such that the ruling direction of the grating 30 is perpendicular to the laser discharge direction between the electrodes 23 and 24 in the laser chamber 20.

Generally, the spreading angle of the laser beam transmitting through window 22 of the laser chamber is smaller in a direction perpendicular to the discharge direction than in the discharge direction of electrodes 23 and 24, that is, the direction of arrangement of electrodes 23 and 24. Therefore, by making the ruling direction of the grating coincide with the direction perpendicular to the direction of laser discharge, the spreading of the beam caused by the grating 30 can be made minimum. This can efficiently narrow the bandwidth.

Another embodiment shown in FIGS. 2a and 2b is constituted by a so called grazing incidence mount. In FIGS. 2a and 2b and following drawings, parts having the same functions as those of the embodiment shown in FIGS. 1a and 1b are designated by the same reference numerals. In the embodiment shown in FIGS. 2a and 2b, the grating 30 of the embodiment shown in FIGS. 1a and 1b is constituted by a grating 31 and a total reflection mirror 32. Other parts are identical to those shown in FIGS. 1a and 1b. In the embodiment shown in FIGS. 2a and 2b, the total reflection mirror 32 acts as the rear mirror of the narrow-band excimer laser and the grating 31 acts as a wavelength selection element which selects a laser beam having a specific wavelength. In the embodiment shown in FIGS. 2a and 2b, electrodes 23 and 24, grating 31 and total reflection mirror 32 are arranged such that the ruling direction of the grating 31 is perpendicular to the direction of laser discharge between electrodes 23 and 24. As a consequence, the spreading of the laser beam projected in the ruling direction of the grating becomes a minimum. Thus, it is possible to minimize the spreading of the laser beam projected in the ruling direction of the grating, whereby it is possible to minimize the spreading of the beam at the grating 31. Thus the bandwidth can be narrowed at a high efficiency.

Figure 3:
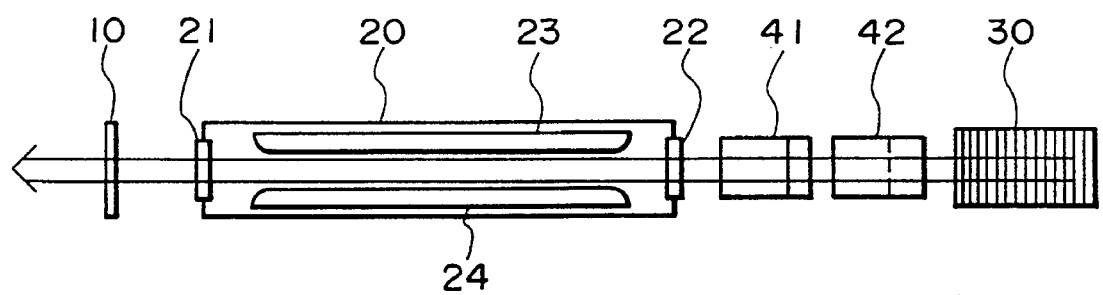
FIGS. 3a and 3b are a side view and a plan view respectively showing a still another embodiment in the form of Littrow mount with a prism beam expander.
Figure 3:
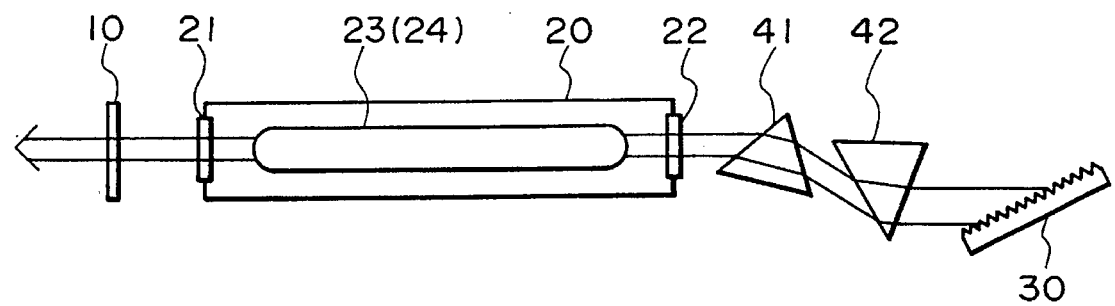

In the modified embodiment shown in FIGS. 3a and 3b, prisms 41 and 42 constitute a beam expander which projects the laser beam outputted from the laser chamber 20 upon the grating 31 after expansion. In this modification, the ruling direction of the grating is perpendicular to the direction of discharge between electrodes 23 and 24 in the laser chamber 20. The direction of expanding the laser beam effected by prisms 41 and 42 (that is a direction perpendicular to the direction of an edge of the prism) coincides with the ruling direction of the grating 30, that is the direction perpendicular to the direction of discharge between electrodes 23 and 24 in the laser chamber 20.

By using a beam expander of this construction, the expanding angle at the grating 30 can be made smaller by a reciprocal of the percentage of expanding effected by the beam expander, thus increasing the line-narrowing efficiency.

Figure 4:
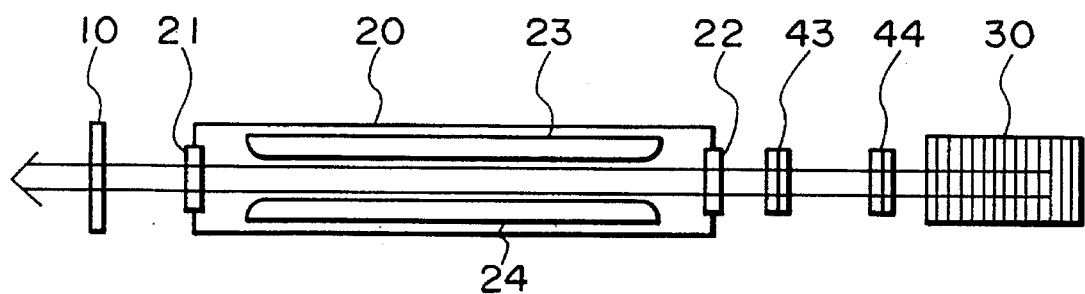
FIGS. 4a and 4b are a side view and a plan view respectively showing a further embodiment of this invention in the form of Littrow mount with a beam expander made up of a cylindrical lens.
Figure 4:
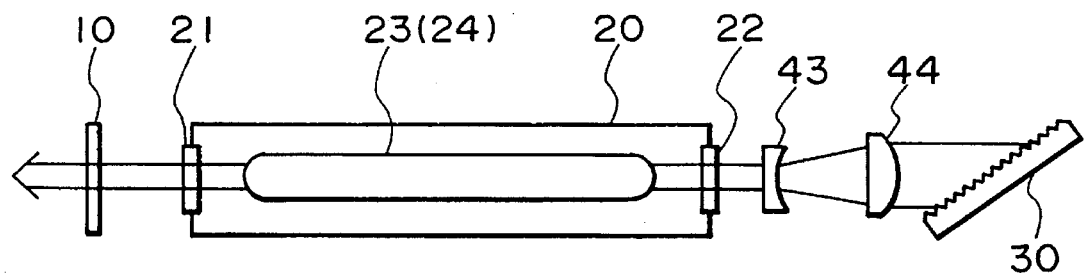

In another modification shown FIGS. 4a and 4b, a beam expander made up of prisms 41 and 42 shown in FIGS. 3a and 3b is substituted by a beam expander made up of cylindrical lenses 43 and 44. In this modification too, the ruling direction of the grating 30 is perpendicular to the direction of discharge between electrodes 23 and 24 in the laser chamber 20. The beam expanding direction of the beam expander effected by the cylindrical lenses 43 and 44 is made to coincide with the ruling direction of the grating 30.

Figure 5:
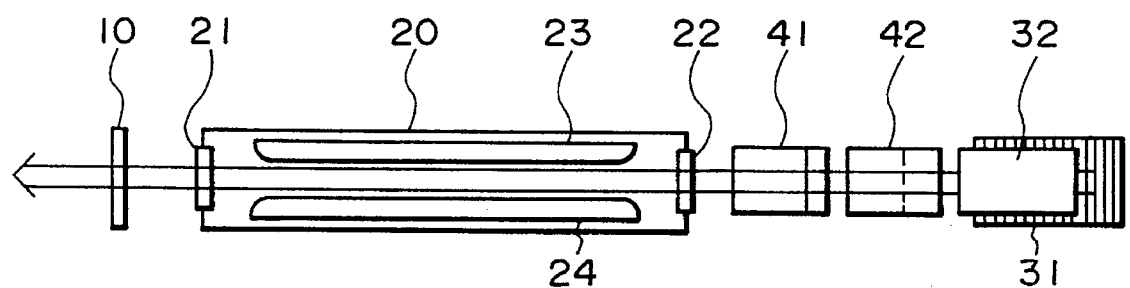
FIGS. 5a and 5b are a side view and a plan view respectively showing a still further embodiment of this invention in the form of grazing incidence mount with a prism beam expander.
Figure 5:
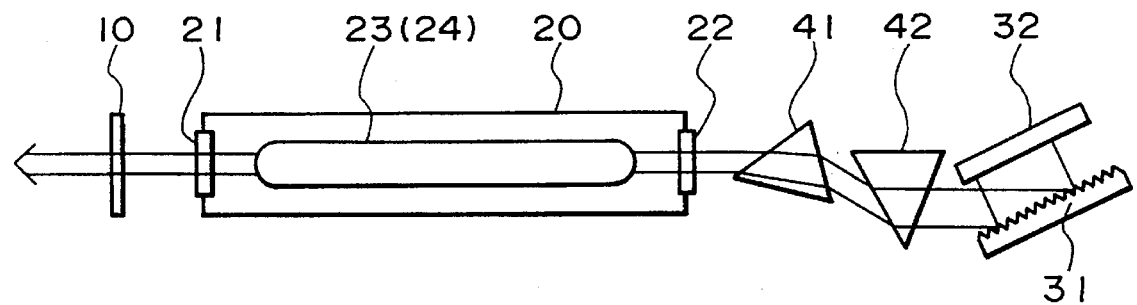

In a further modification shown in FIGS. 5a and 5b, in place of the grating shown in FIGS. 3a and 3b, grazing incidence mount is used comprising a grating 31 and a total reflection mirror 32.

Figure 6:
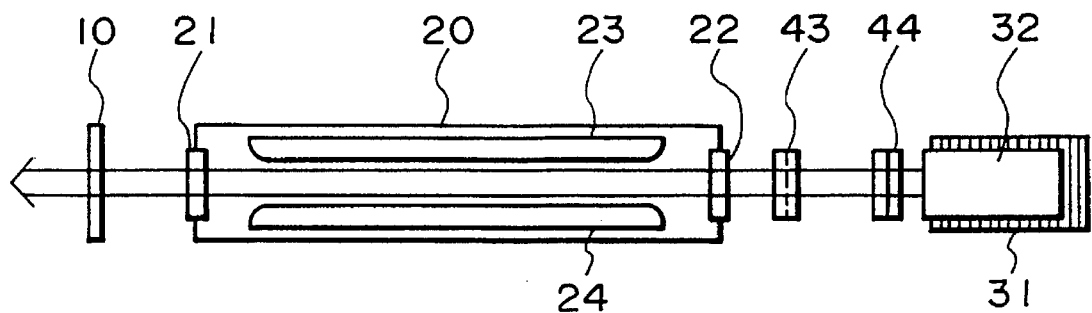
FIGS. 6a and 6b are a side view and a plan view respectively showing a yet another embodiment of this invention in the form of grazing incidence mount with a cylindrical lens beam expander.
Figure 6:
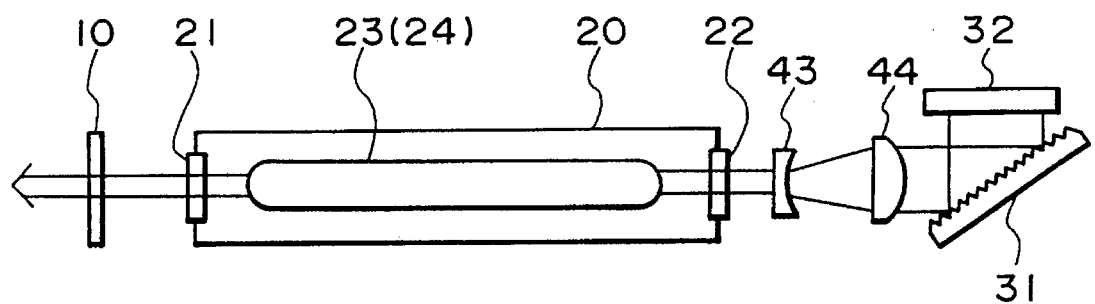

In another modification shown in FIGS. 6a and 6b, in place of the grating 30 shown in FIGS. 4a and 4b, grazing incidence mount is used made up of a grating 31 and a total reflection mirror 32.

The embodiment shown in FIGS. 5a and 5b is constructed such that the ruling direction of the grating 31 is perpendicular to the direction of discharge between electrodes 23 and 24 in the laser chamber 20 and that the direction of beam expanding effected by the beam expander including prisms 41 and 42 coincides with the direction of ruling direction of the grating 31.

The modification shown in FIGS. 6a and 6b is constructed such that the ruling direction of the grating 31 is made to be perpendicular to the direction of discharge between electrodes 23 and 24 in the laser chamber 20, whereas the direction of beam expanding in the beam expander caused by lenses 43 and 44 is made to coincide with the ruling direction of the grating 31.

Figure 2:
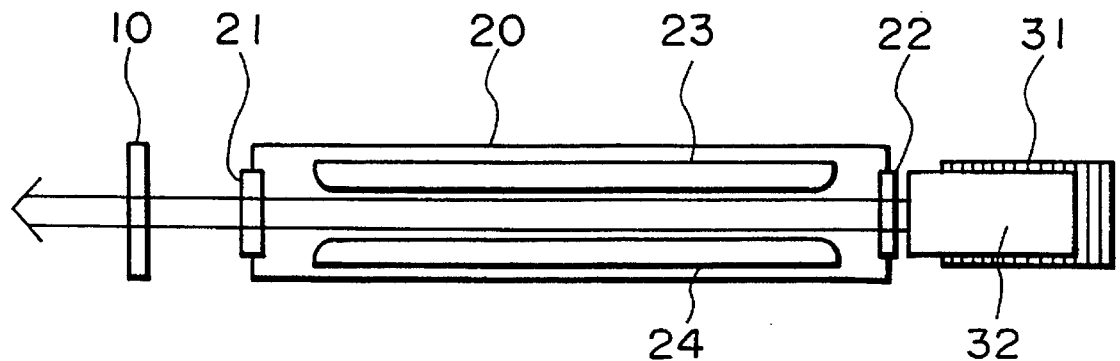
FIGS. 2a and 2b are a side view and a plan view respectively of another embodiment of this invention in the form of grazing incidence mount.
Figure 2:
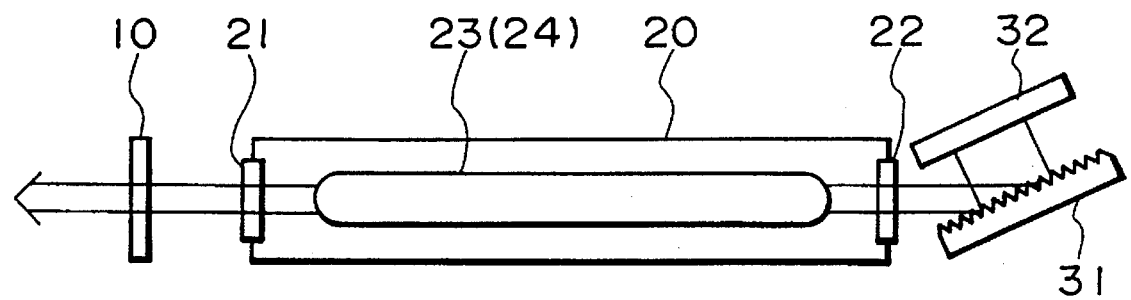

In another embodiment shown in FIGS. 7a and 7b, a member 51 formed with an aperture is inserted between front mirror 10 and the laser chamber 20, and another member 52 formed with an aperture is inserted between the laser chamber 20 and grating 30 in the embodiment of FIG. 1. The apertures provided for members 51 and 52 have longer sides in parallel with the direction of discharge between electrodes 23 and 24 in the laser chamber.

Figure 7:
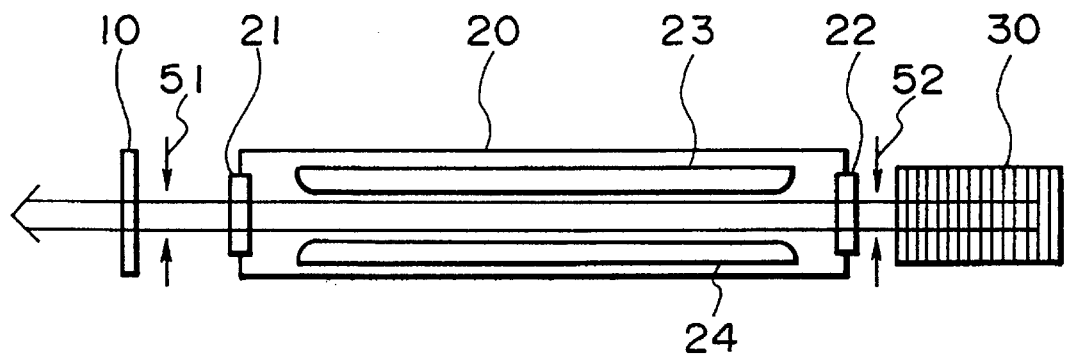
FIGS. 7a and 7b are a side view and a plan view respectively showing another embodiment of this invention wherein apertured members are used.
Figure 7:
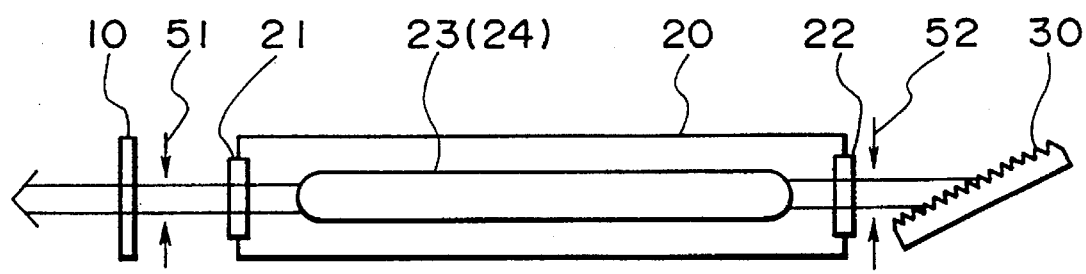
Figure 8:
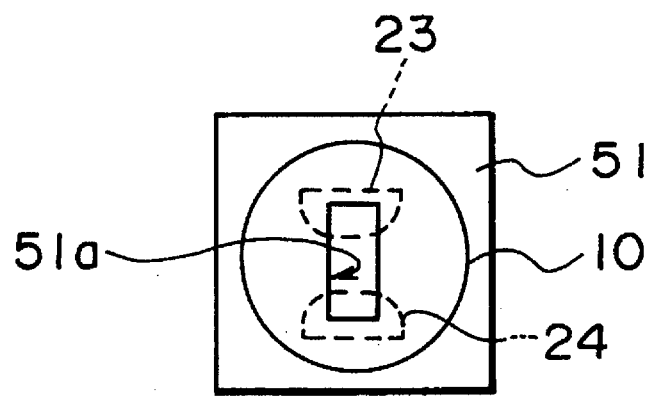
FIG. 8 is an end view of the embodiment shown in FIG. 7 as seen in the direction of the front mirror.

FIG. 8 is a view as seen from the front mirror side in FIG. 7.

In FIG. 8, an aperture 51a is shown behind the front mirror 10, and the laser chamber 20 is shown behind the aperture 51a. The apertures 51a are rectangular in shape having longer sides in parallel with the direction of discharge between electrodes 23 and 24 in the laser chamber 20. The apertured member 52 inserted between the laser chamber 20 and the grating 30 has the same construction as the apertured member 51 shown in FIG. 8.

The spread angle of the laser beam outputted from laser chamber 20 is smaller in a direction perpendicular to the discharge between electrodes 23 and 24 than in the direction of the discharge, as has been described hereinabove. In the same manner as has been described in connection with the foregoing embodiments where rectangular apertures having longer sides in parallel with the direction of discharge, the laser beam emitted from the laser chamber can be efficiently transmitted, thereby minimizing the attenuation of the output level caused by the apertured members. In the embodiment shown in FIGS. 7a and 7b, two apertured members are inserted, but insertion of only one apertured member is sufficient. In the embodiments shown in FIGS. 2a and 2b through FIGS. 6a and 6b too, apertured members can be inserted in the same manner as in FIGS. 7a and 7b.

In this case, the aperture is of a shape having longer sides parallel with the direction of laser discharge. It should be understood that the configuration of the aperture is not limited to rectangular but may be elliptical. Further, the aperture members can be inserted at one point or three or more points.

Figure 9:
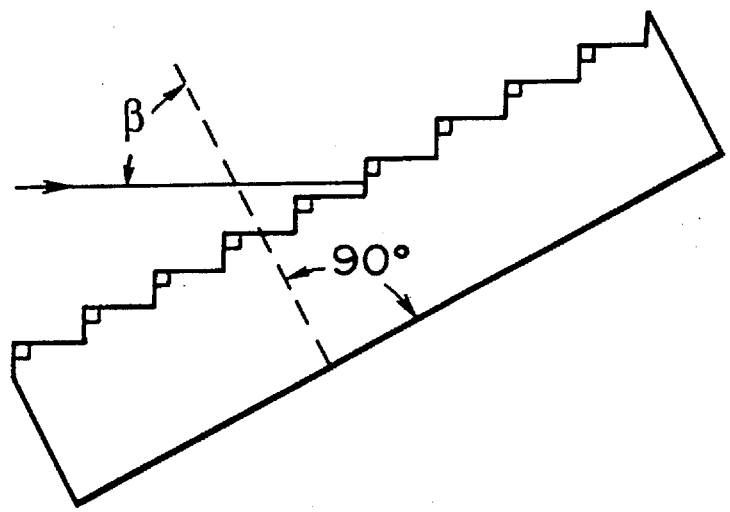
FIG. 9 is a side view showing an example of an echelle grating.

In the embodiments shown in FIGS. 1a, 1b, 3a, 3b, 4a, 4b, 7a and 7b utilizing Littrow mount, use of an echelle grating as shown in FIG. 9 is advantageous as the grating 30. In FIG. 9, the top angle of each groove is substantially right angles, and as it is possible to manufacture a grating having a large blaze angle β, the echelle grating has a large efficiency and a large resolution. Consequently in the embodiments shown in FIGS. 1a, 1b, 3a, 3b, 4a, 4b, 7a and 7b, where an echelle grating as shown in FIG. 9 is used, by making its blaze angle to coincide with the incident angle and diffraction angle of the laser beam, the bandwidth can be more efficiently narrowed. Thus, the bandwidth can be sufficiently narrowed with a single grating.

In still another embodiment shown in FIGS. 10a and 10b wherein the front mirror 10 shown in FIG. 1 is replaced by a cylindrical mirror 60 which is disposed with it axis in alignment with direction of discharge between electrodes 23 and 24.

The radius of curvature of the cylindrical mirror 60 is selected such that the beam waiste of the laser beam reaches on the grating. More particularly, the radius of curvature of the cylindrical mirror 60 is selected such that an equation R=2L holds, where R represents the radius of curvature of the cylindrical mirror 60, and L represents the cavity length of the laser device, that is, the distance between the cylindrical mirror 60 and the axis of rotation of the grating 30. Furthermore, the axis of the cylindrical mirror 60 and the axis of the grating 30 are aligned with each other. As a consequence, narrowing of the bandwidth of the laser beam can be realized more efficiently.

Also in the embodiments shown in FIGS. 2a, 2b through 6a and 6b by substituting the front mirror 10 with a cylindrical mirror 60 shown in FIGS. 10a and 10b, narrowing of the bandwidth can also be made at a high efficiency.

In the embodiment shown in FIGS. 10a and 10b, one or more apertured members can be inserted. One example of this construction is shown by FIGS. 11a and 11b.

Figure 11:
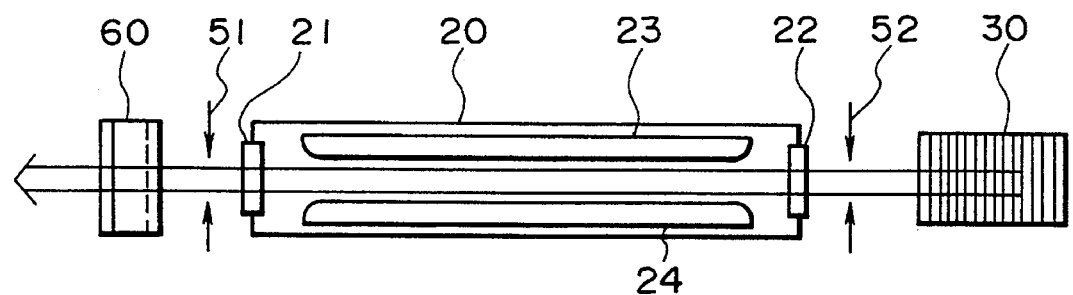
FIGS. 11a and 11b are a side view and a plan view respectively showing another embodiment of this invention utilizing a cylindrical mirror as a front mirror and inserted with apertured members.
Figure 11:
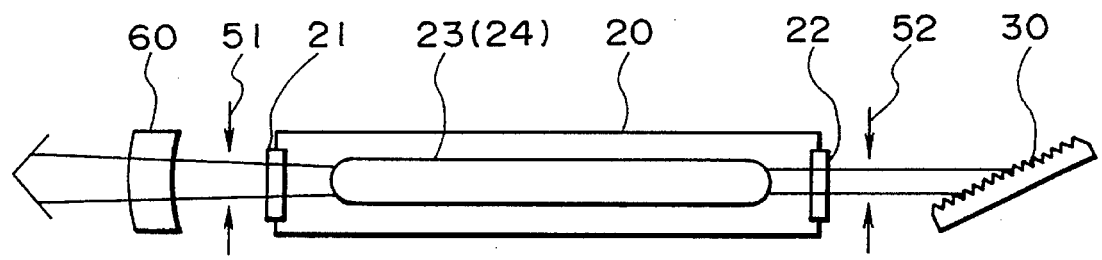

In the embodiment shown in FIGS. 11a and 11b, an apertured member 51 is disposed between the cylindrical mirror 60 and laser chamber 20 and a similar apertured member 52 is disposed between the laser chamber 20 and grating 30. The aperture has an elongated configuration along the direction of discharge between electrodes 23 and 24 in the laser chamber 20 as shown in FIG. 8.

Figure 10:
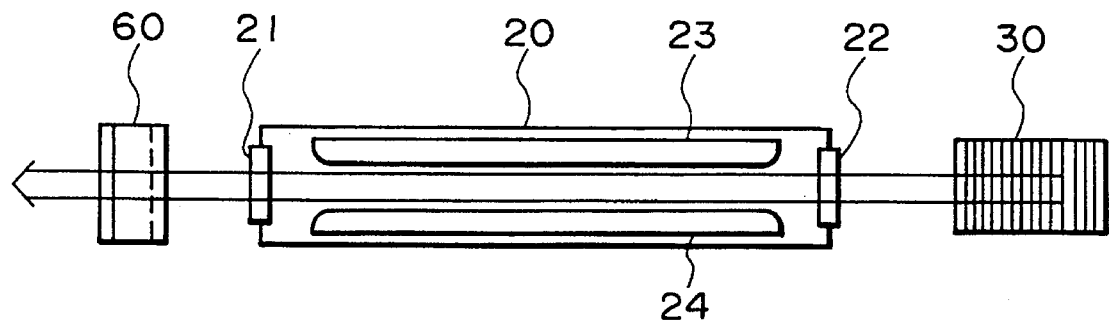
FIGS. 10a and 10b are a side view and a plan view respectively showing yet another embodiment of this invention utilizing a cylindrical mirror as a front mirror.
Figure 10:
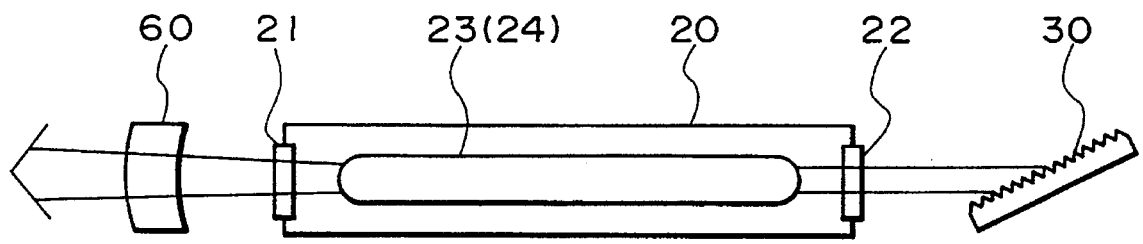

In a modified construction shown in FIGS. 2a, 2b through FIGS. 6a and 6b in which the front mirror 10 has been substituted by a cylindrical mirror shown in FIG. 10, one or more apertured members can be inserted as shown in FIGS. 11a and 11b.

In various embodiments described above, it is not always necessary to make the direction of discharge between electrodes 23 and 24 in the laser chamber to be exactly perpendicular the ruling direction of the grating 30 or 31. So long as the ruling direction of the grating 30 or 31 is substantially perpendicular to the direction of discharge between electrodes 23 and 24, a wavelength control can be made with a sufficiently high efficiency.

Furthermore, it is not always necessary to exactly coincide the beam expanding direction effected by prisms 41 and 42 or cylindrical lenses 43 and 44 with the ruling direction of the grating 30 or 31. So long as the direction of beam expansion effected by a beam expander substantially coincides with the ruling direction of the grating 30 or 31, the wavelength control can be made at a sufficiently high efficiency.

In the construction where a cylindrical mirror 60 is used as a front mirror, so long as it is constructed that the axis of the cylindrical mirror 60 substantially coincides with the direction of discharge between electrodes 23 and 24, that the radius of curvature substantially satisfies with equation R=2L, and that the axis of the cylindrical mirror 60 substantially align with axis of rotation of the grating control of the wavelength can be made at a sufficiently high efficiency.

APPLICABILITY TO INDUSTRY

According to this invention, it is possible to narrow the bandwidth at an extremely high efficiency. Furthermore, it is possible to provide a narrow band excimer laser with good durability. The narrow band excimer laser of this invention is especially suitable to use as a light source of a size reducing image projection light exposure device.

We claim:

1. A narrow-band excimer laser comprising:

a laser chamber within which a laser gas is filled and a pair of elongated first and second electrodes for discharging and exciting the laser gas are disposed in parallel with each other and along a longitudinal direction of the laser chamber, a front mirror disposed in front of the laser chamber, for reflecting a part of a laser beam output from the laser chamber in a forward direction and transmitting the rest of the laser beam; and a grating disposed behind the laser chamber in a direction having a predetermined angle with respect to a laser beam output from the laser chamber in backward direction and having a plurality of grooves formed on a surface thereof in a predetermined direction, for selectively reflecting in a direction toward the laser chamber a laser beam having a desired wavelength of the laser beam output from the laser chamber in a backward direction, wherein the grating is disposed so that the grooves thereof are directed in a direction substantially parallel with a plane containing the discharge direction by the first and second electrodes and said longitudinal direction.

2. The narrow-band excimer laser according to claim 1 wherein the grating is of an echelle type grating.

3. The narrow-band excimer laser according to claim 1 further comprising a beam expander disposed between the laser chamber and the grating, for expanding the laser beam output from the laser chamber in a predetermined direction, the beam expander being disposed so that the beam expansion direction of the laser beam is substantially perpendicular to the direction of the electrical discharge by the first and second electrodes.

4. The narrow-band excimer laser according to claim 3 wherein the beam expander comprises a prism having an edge direction thereof substantially in parallel with the direction of the electrical discharge by the first and second electrodes.

5. The narrow-band excimer laser according to claim 3 wherein the beam expander comprises a cylindrical lens having a mechanical axis substantially in parallel with the direction of the electrical discharge by the first and second electrodes.

6. The narrow-band excimer laser according to claim 1 further comprising an aperture disposed between the grating and the front mirror and having an elongated hole, for transmitting the laser beam output from the laser chamber through the elongated hole, wherein the elongated hole is longer in the direction of the electrical discharge by the first and second electrodes than in a direction perpendicular to the direction of the electrical discharge.

7. The narrow-band excimer laser according to claim 3 further comprising an aperture disposed between the grating and the front mirror and having an elongated hole, for transmitting the laser beam output from the laser chamber through the elongated hole, wherein the elongated hole is longer in the direction of the electrical discharge by the first and second electrodes than in a direction perpendicular to the direction of the electrical discharge.

* * * * *

UNITED STATES PATENT AND TRADEMARK OFFICE
CERTIFICATE OF CORRECTION

PATENT NO.   :   5,596,596
DATED        :   January 21, 1997
INVENTOR(S)  :   Wakabayashi *et al.*

It is certified that error appears in the above-indentified patent and that said Letters Patent is hereby corrected as shown below:

IN THE CLAIMS:

Column 7    Line 32-Column 8 Line 4: Delete Claim 3 and insert therefor:
3. The narrow-band excimer laser according to claim 1, wherein the beam expander comprises a prism having an edge direction thereof substantially in parallel with the direction of the electrical discharge by the first and second electrodes.

Column 8    Lines 5-9: Delete Claim 4 and insert therefor:
4. The narrow-band excimer laser according to claim 1, wherein the the beam expander comprises a cylindrical lens having a mechanical axis substantially in parallel with the direction of the electrical discharge by the first and second electrodes.

Column 8    Lines 10-14: Delete Claim 5 and insert therefor:
5. The narrow-band excimer laser according to claim 1, further comprising an aperture disposed between the grating and the front mirror and having an elongated hole, for transmitting the laser beam output from the laser chamber through the elongated hole,
    wherein the elongated hole is longer in the direction of the electrical discharge by the first and second electrodes than in a direction perpendicular to the direction of the electrical discharge.

Signed and Sealed this

Twenty-second Day of July, 1997

Attest:

BRUCE LEHMAN

*Attesting Officer*          Commissioner of Patents and Trademarks

UNITED STATES PATENT AND TRADEMARK OFFICE
CERTIFICATE OF CORRECTION

PATENT NO. : 5,596,596
DATED : January 21, 1997
INVENTOR(S) : Wakabayashi et al

It is certified that error appears in the above-identified patent and that said Letters Patent is hereby corrected as shown below:

IN THE CLAIMS:

Column 7  Lines 6-29:  Delete Claim 1 and insert therefor:

1. A narrow-band excimer laser comprising:

a laser chamber within which a laser gas is filled and a pair of elongated first and second electrodes for discharging and exciting the laser gas are disposed in parallel with each other an along longitudinal direction of the laser chamber, a front mirror disposed in front of the laser chamber, for reflecting a part of a laser beam output from the laser chamber in a forward direction and transmitting the rest of the laser beam;

a grating disposed behind the laser chamber in a direction having a predetermined angle with respect to a laser beam output from the laser chamber in backward direction and having a plurality of grooves formed on a surface thereof in a predetermined direction, for selectively reflecting in a direction toward the laser chamber a laser beam having a desired wavelength of the laser beam output from the laser chamber in a backward direction, the grating being disposed so that the grooves thereof are directed in a direction substantially parallel with a plane containing the discharge direction by the first and second electrodes and longitudinal direction of the electrodes; and

UNITED STATES PATENT AND TRADEMARK OFFICE
CERTIFICATE OF CORRECTION

PATENT NO. : 5,596,596
DATED : January 21, 1997
INVENTOR(S) : Wakabayashi et al

It is certified that error appears in the above-identified patent and that said Letters Patent is hereby corrected as shown below:

Cont.

a beam expander disposed between the laser chamber and the grating, for expanding the laser beam output from the laser chamber in a predetermined direction, the beam expander being disposed so that the beam expansion direction of the laser beam is substantially perpendicular to the direction of the electrical discharge by the first and second electrodes.

Signed and Sealed this

Ninth Day of December, 1997

*Attest:*

BRUCE LEHMAN

*Attesting Officer*  Commissioner of Patents and Trademarks